(12) United States Patent
Iizuka et al.

(10) Patent No.: US 11,319,445 B2
(45) Date of Patent: May 3, 2022

(54) SILOXANE RESIN COMPOSITION, ADHESIVE USING SAME, DISPLAY DEVICE, SEMICONDUCTOR DEVICE, AND ILLUMINATION DEVICE

(71) Applicant: Toray Industries, Inc., Tokyo (JP)

(72) Inventors: Eisuke Iizuka, Otsu (JP); Michiko Yamaguchi, Otsu (JP); Mitsuhito Suwa, Otsu (JP); Masao Kamogawa, Otsu (JP)

(73) Assignee: Toray Industries, Inc.

( * ) Notice: Subject to any disclaimer, the term of this patent is extended or adjusted under 35 U.S.C. 154(b) by 229 days.

(21) Appl. No.: 16/634,369

(22) PCT Filed: Jun. 21, 2018

(86) PCT No.: PCT/JP2018/023623
§ 371 (c)(1),
(2) Date: Jan. 27, 2020

(87) PCT Pub. No.: WO2019/026458
PCT Pub. Date: Feb. 7, 2019

(65) Prior Publication Data
US 2021/0095124 A1      Apr. 1, 2021

(30) Foreign Application Priority Data
Aug. 2, 2017   (JP) .............................. JP2017-149878

(51) Int. Cl.
| | | |
|---|---|---|
| *C08G 77/12* | (2006.01) | |
| *C08L 83/04* | (2006.01) | |
| *C08F 220/18* | (2006.01) | |
| *C08G 77/16* | (2006.01) | |
| *C08G 77/20* | (2006.01) | |
| *C08K 5/06* | (2006.01) | |
| *C08K 5/132* | (2006.01) | |

(52) U.S. Cl.
CPC ........ *C08L 83/04* (2013.01); *C08F 220/1804* (2020.02); *C08G 77/12* (2013.01); *C08G 77/16* (2013.01); *C08G 77/20* (2013.01); *C08K 5/06* (2013.01); *C08K 5/132* (2013.01); *C08G 2170/00* (2013.01); *C08L 2203/20* (2013.01)

(58) Field of Classification Search
CPC ........ C08G 77/16; C08G 77/12; C08G 77/28; C08G 77/20; C08G 18/615; H01L 21/52
See application file for complete search history.

(56) References Cited

U.S. PATENT DOCUMENTS

| | | | |
|---|---|---|---|
| 2015/0378258 A1* | 12/2015 | Araki ..................... | G03F 7/105 430/18 |
| 2016/0102229 A1* | 4/2016 | Takarada ............... | C09J 133/08 156/250 |
| 2016/0161847 A1 | 6/2016 | Araki et al. | |
| 2019/0101828 A1 | 4/2019 | Hibino et al. | |

FOREIGN PATENT DOCUMENTS

| | | |
|---|---|---|
| JP | 2010039056 A | 2/2010 |
| WO | 2011024836 A1 | 3/2011 |
| WO | 2014126013 A1 | 8/2014 |
| WO | 2014156520 A1 | 10/2014 |
| WO | 2015012228 A1 | 1/2015 |
| WO | 2017188047 A1 | 11/2017 |

OTHER PUBLICATIONS

International Search Report and Written Opinion for International Application No. PCT/JP2018/023623, dated Sep. 4, 2018, 8 pages.

* cited by examiner

Primary Examiner — Kuo Liang Peng
(74) Attorney, Agent, or Firm — RatnerPrestia

(57) ABSTRACT

Provided is a siloxane resin composition having excellent adhesion and fine patterning properties. The siloxane resin composition contains: a siloxane resin (A) including a structure represented by general formula (1), a structure represented by general formula (2), and a structure represented by general formula (3); a compound (B) having an unsaturated double bond; a photopolymerization initiator (C); and a solvent (D).

10 Claims, No Drawings

SILOXANE RESIN COMPOSITION, ADHESIVE USING SAME, DISPLAY DEVICE, SEMICONDUCTOR DEVICE, AND ILLUMINATION DEVICE

CROSS REFERENCE TO RELATED APPLICATIONS

This is the U.S. National Phase application of PCT/JP2018/023623, filed Jun. 21, 2018, which claims priority to Japanese Patent Application No. 2017-149878, filed Aug. 2, 2017, the disclosures of these applications being incorporated herein by reference in their entireties for all purposes.

FIELD OF THE INVENTION

The present invention relates to a siloxane resin composition, an adhesive using it, and a display device, a semiconductor device, and a lighting device having it.

BACKGROUND OF THE INVENTION

Adhesives are used in the assembly of many electronic devices including display panel type display devices, optical device based semiconductor units, and LED lighting devices. Liquid type and film type optical adhesives are generally used for bonding cover lenses, touch panel sensors, display modules, etc., adopted as members of display panel type display devices, and acrylic resin based optical adhesives, which can develop high adhesive strength, are widely used. In line with recent trends towards downsizing of electronic devices, these optical adhesives are required to achieve high adhesiveness and fine pattern processability.

Examples of proposed optical adhesives having high adhesiveness include a sticking agent composition for optical films in the form of a composition composed mainly of a (meth)acrylic polymer incorporating, as monomer units, an alkyl (meth)acrylate and a hydroxyl group-containing monomer, and a polyether compound that has both a polyether backbone and a reactive silyl group at least at one end (for example, see Patent document 1), and an optical adhesive formed of a silicone based curable composition containing an organosiloxane having two alkenyl groups in a molecule, an organosiloxane having two hydrosilyl groups in a molecule, a crosslinking agent having a total of three or more of alkenyl groups and hydrosilyl groups in a molecule, and a hydrosilylation catalyst (for example, see Patent document 2).

PATENT DOCUMENTS

Patent document 1: Japanese Unexamined Patent Publication (Kokai) No. 2012-255172
Patent document 2: Japanese Unexamined Patent Publication (Kokai) No. 2012-62424

SUMMARY OF THE INVENTION

Although good in terms of adhesiveness, however, there are problems with the techniques described in Patent documents 1 and 2 as they are inferior in fine pattern processability and, in particular, have difficulty in micron-level fine processing. Thus, the main object of the present invention is to provide a siloxane resin composition that is high in adhesiveness and fine pattern processability.

As a result of intensive studies, the present inventors arrived at the present invention after finding that the use of a siloxane resin having a specific chemical structure serves to achieve a large increase in adhesiveness and fine pattern processability.

Specifically, to solve the above problems, the present invention is mainly configured as described below.

A siloxane resin composition including a siloxane resin (A) containing a structure as represented by the undermentioned general formula (1), a structure as represented by the undermentioned general formula (2), and a structure as represented by the undermentioned general formula (3), a compound (B) containing an unsaturated double bond, a photo-initiator (C), and a solvent (D):

[Chemical formula 1]

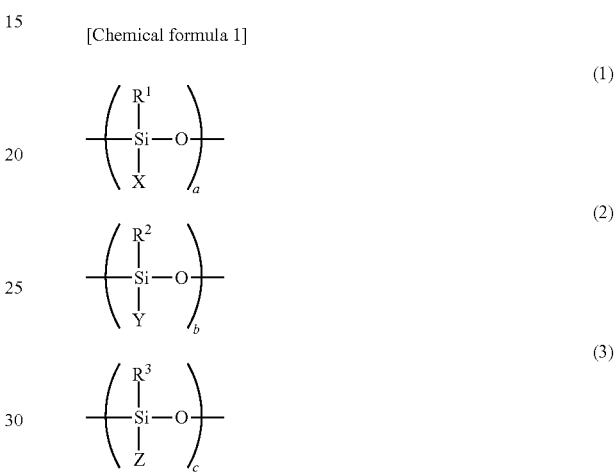

In general formulae (1) to (3), $R^1$, $R^2$, and $R^3$ are each independently a hydrogen atom, a hydroxy group, a group having a siloxane bond, or a monovalent organic group having 1 to 30 carbon atoms; X is an alkenyl group, an alkynyl group, a monovalent organic group having a nitrogen atom and a carbon-oxygen unsaturated bond, or a monovalent organic group having a cyclic ether bond; Y is a monovalent organic group having a photoradical polymerizable group (other than alkenyl groups and alkynyl groups); Z is a monovalent organic group having an alkali soluble group; a, b, and c are each independently an integer of 1 or more; and if a to c are 2 or more, the plurality of $R^1$'s, $R^2$'s, $R^3$'s, X's, and Y's may be identical to or different from each other.

The siloxane resin composition according to the present invention is high in adhesiveness and fine pattern processability. The siloxane resin composition according to the present invention serves to produce a cured fine pattern that is high in adhesiveness.

DETAILED DESCRIPTION OF EMBODIMENTS OF THE INVENTION

The siloxane resin composition according to the present invention includes a siloxane resin (A) containing a structure as represented by the aforementioned general formula (1), a structure as represented by the aforementioned general formula (2), and a structure as represented by the aforementioned general formula (3), a compound (B) containing an unsaturated double bond, a photo-initiator (C), and a solvent (D). The inclusion of a structure as represented by the aforementioned general formula (1) in the siloxane resin (A) serves to develop adhesiveness and adhere a plurality of adherends. The inclusion of a structure as represented by the aforementioned general formula (2) in the siloxane resin (A) serves to develop photocurability and improve photolithographic fine pattern processability. Furthermore, the inclusion of a structure as represented by the aforementioned general formula (3) in the siloxane resin (A) serves to develop solubility in alkali developers and improve photolithographic fine pattern processability. The compound (B) having an unsaturated double bond works to develop photocurability and improve photolithographic fine pattern processability. The photo-initiator (C) works to develop photocurability and improve photolithographic fine pattern processability. The solvent (D) acts to develop flowability by dissolving the siloxane resin composition and improve coatability.

For the siloxane resin composition according to the present invention, the siloxane resin (A) is a polymer with a backbone chain containing a siloxane bond. The siloxane resin (A) with a backbone chain containing a siloxane bond is high in reworkability (workability in recombining the adherend after combining and peeling) in the case where the siloxane resin composition is used as adhesive, and also high in resistance to weather and heat. The siloxane resin (A) according to the present invention contains a structure as represented by the undermentioned general formula (1), a structure as represented by the undermentioned general formula (2), and a structure as represented by the undermentioned general formula (3).

[Chemical formula 2]

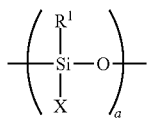  (1)

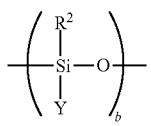  (2)

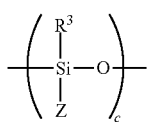  (3)

In general formulae (1) to (3), $R^1$, $R^2$, and $R^3$ are each independently a hydrogen atom, a hydroxy group, a group having a siloxane bond, or a monovalent organic group having 1 to 30 carbon atoms. Examples of the monovalent organic group having 1 to 30 carbon atoms include alkyl group having 1 to 30 carbon atoms, alkoxy group having 1 to 30 carbon atoms, arylene group containing 6 to 30 carbon atoms such as phenyl group, and aryloxy group containing 6 to 30 carbon atoms such as phenoxy group. In these groups, at least part of the hydrogen atoms may be substituted. Of these, an alkyl group having 1 to 30 carbon atoms and an alkoxy group having 1 to 30 carbon atoms are preferred.

From the viewpoint of stabilizing the polymerization reactivity of the siloxane resin, preferred examples of the alkyl group having 1 to 30 carbon atoms include alkyl groups having 1 to 12 carbon atoms, of which methyl group, ethyl group, propyl group, isopropyl group, butyl group, isobutyl group, s-butyl group, t-butyl group, pentyl group, hexyl group, heptyl group, octyl group, 2-ethylhexyl group, nonyl group, and decyl group are more preferred. From the viewpoint of rapid progress of the polymerization reaction of the siloxane resin, preferred examples of the alkoxy group having 1 to 30 carbon atoms include alkoxy group having 1 to 12 carbon atoms, of which methoxy group, ethoxy group, propoxy group, isopropoxy group, butoxy group, isobutoxy group, s-butoxy group, and t-butoxy group are more preferred.

In general formulae (1) to (3), a, b, and c are each independently an integer of 1 or more; and if a to c are 2 or more, the plurality of $R^1$'s, $R^2$'s, $R^3$'s, X's, and Y's may be identical to or different from each other. From the viewpoint of improving the adhesiveness and fine pattern processability, a to c are each preferably 2 or more, and more preferably 5 or more. On the other hand, from the viewpoint of improving the solubility of the siloxane resin (A) in an alkali developer to further increase the fine pattern processability, a to c are preferably 300 or less, more preferably 200 or less.

In general formula (1), X is an alkenyl group, an alkynyl group, a monovalent organic group having a nitrogen atom and a carbon-oxygen unsaturated bond, or a monovalent organic group having a cyclic ether bond.

Examples of the alkenyl group include vinyl group and allyl group. Examples of the alkynyl group include acetylene group.

Examples of the monovalent organic group having a nitrogen atom and a carbon-oxygen unsaturated bond include urea group, ureido group, isocyanate group, and isocyanurate group.

Examples of the monovalent organic group having a cyclic ether bond include glycidyl group and oxetanyl group.

In general formula (1), X is preferably a vinyl group or a monovalent organic group having a cyclic ether bond from the viewpoint of improving the adhesiveness. Furthermore, in general formula (1), X preferably has 8 or more carbon atoms. If X has 8 or more carbon atoms, it will serve to produce a cured siloxane resin composition that is resistant to fracture when bent, and the cured product will have improved flexibility. In addition, as the siloxane backbone increases in flexibility, the crack resistance will further increase.

In general formula (2), Y is a monovalent organic group having a photoradical polymerizable group (except alkenyl groups and alkynyl groups). Examples of the photoradical polymerizable group include (meth)acryloyl groups and maleimide groups. Of these, (meth)acryloyl groups are more preferred from the viewpoint of further improving the fine pattern processability.

In general formula (3), Z is a monovalent organic group having an alkali soluble group. Examples of the alkali soluble group include carboxyl groups, thiol groups, phenolic hydroxyl groups, and sulfonic acid groups. Of these, carboxyl groups are more preferred from the viewpoint of further improving the solubility in alkali developers.

In the case where the siloxane resin (A) has at least two structures each containing any group selected from X, Y, and Z, it is essential for the structures to meet all relevant structural features represented by general formulae (1) to (3).

It is preferable for the siloxane resin (A) to be a hydrolysis condensation product of an organosilane compound having a structure as represented by general formula (1), a structure as represented by general formula (2), and a structure as represented by general formula (3). It may be a hydrolysis condensation product with another organosilane compound.

The siloxane resin (A) may be a random copolymer, instead of a block copolymer, of such organosilane compounds.

Examples of organosilane compounds containing structures as represented by general formula (1) include alkenyl group-containing organosilane compounds such as vinyl group-containing organosilane compounds including vinyl trimethoxysilane, vinyl triethoxysilane, vinyl tri(methoxyethoxy)silane, vinyl tripropoxysilane, vinyl phenyl trimethoxysilane, vinyl phenyl triethoxysilane, vinyl methyl dimethoxysilane, vinyl methyl diethoxysilane, vinyl phenyl dimethoxysilane, vinyl phenyl diethoxysilane, vinyl methyl di(methoxyethoxy) silane, vinyl dimethyl methoxysilane, vinyl dimethyl ethoxysilane, vinyl tris-methoxyethoxysilane, divinyl methyl methoxysilane, divinyl methyl ethoxysilane, butenyl trimethoxysilane, pentenyl trimethoxysilane, hexenyl trimethoxysilane, heptenyl trimethoxysilane, and octenyl trimethoxysilane, and allyl group-containing organosilane compounds including allyl trimethoxysilane, allyl triethoxysilane, allyl tri(methoxyethoxy)silane, allyl methyl dimethoxysilane, allyl methyl diethoxysilane, allyl methyl di(methoxyethoxy)silane, allyl dimethyl methoxysilane, allyl dimethyl ethoxysilane, styryl trimethoxysilane, styryl triethoxysilane, styryl tri(methoxyethoxy)silane, styryl methyl dimethoxysilane, styryl methyl diethoxysilane, and styryl methyl di(methoxyethoxy)silane; alkynyl-group containing organosilane compounds such as [bicyclo [2.2.1]hepta-5-ene-2-yl] triethoxysilane, (buta-3-yn-1-yloxy)(tert-butyl) dimethyl silane, tert-butyl dimethyl (2-propynyloxy)silane, and propargyl [3-(triethoxysilyl)propyl] carbamate; and organosilane compounds containing a nitrogen atom and carbon-oxygen unsaturated bond such as ureidopropyl trimethoxysilane, ureidopropyl triethoxysilane, isocyanate propyl trimethoxysilane, isocyanate propyl triethoxysilane, and tris-(trimethoxysilyl propyl) isocyanurate; and cyclic ether bond-containing organosilane compounds such as glycidyloxypropyl trimethoxysilane, glycidyloxypropyl methyl dimethoxysilane, glycidyloxypropyl trimethoxysilane, glycidyloxypropyl triethoxysilane, glycidyloxybutyl trimethoxysilane, glycidyloxypentyl trimethoxysilane, glycidyloxyhexyl trimethoxysilane, glycidyloxyheptyl trimethoxysilane, glycidyloxyoctyl trimethoxysilane, glycidyloxynonyl trimethoxysilane, glycidyloxydecyl trimethoxysilane, glycidyloxypropyl methyl dimethoxysilane, glycidyloxypropyl methyl diethoxysilane 2-(3,4-glycidyloxycyclohexyl) ethyl trimethoxysilane, 3-(N, N-diglycidyl) aminopropyl trimethoxysilane, oxetanyl trimethoxysilane, and oxetanyl triethoxysilane. Two or more of these may be used in combination.

To specifically explain organosilane compounds containing structures as represented by general formula (1) for the present invention, the general formula (1) for vinyl trimethoxysilane has 1 as a, a vinyl group (—CH═CH$_2$) as X, a methoxy group (—OCH$_3$) as $R^1$, a methyl group (—CH$_3$) as the right-hand bond on the page, and an methoxy group (—OCH$_3$) as the left-hand bond on the page. Organosilane compounds containing structures as represented by general formula (2) and organosilane compounds containing structures as represented by general formula (3) listed below have similar features.

Examples of organosilane compounds containing structures as represented by general formula (2) include (meth)acryloyl group-containing organosilane compounds such as (meth)acryloyl trimethoxysilane, (meth)acryloyl triethoxysilane, (meth)acryloyl tripropoxysilane, (meth)acryloyl ethyl trimethoxysilane, (meth)acryloyl ethyl triethoxysilane, (meth)acryloyl ethyl tripropoxysilane, (meth)acryloyl propyl trimethoxysilane, (meth)acryloyl propyl triethoxysilane, (meth)acryloyl propyl tripropoxysilane, (meth)acryloyl propyl tri(methoxyethoxy) silane, (meth)acryloyl propyl methyl dimethoxysilane, (meth)acryloyl propyl methyl diethoxysilane, (meth)acryloyl propyl dimethyl methoxysilane, (meth) acryloyl propyl diphenyl methoxysilane, di(meth)acryloyl propyl dimethoxysilane, and tri(meth)acryloyl propyl methoxysilane; and maleimide group-containing organosilane compound such as trimethoxysilyl maleimide and triethoxysilyl maleimide. Two or more of these may be used in combination.

Examples of organosilane compounds containing structures as represented by general formula (3) include carboxyl group-containing organosilane compounds such as trimethoxysilyl propylsuccinic anhydride, triethoxysilyl propylsuccinic anhydride, triphenoxysilyl propylsuccinic anhydride, trimethoxysilyl propylphthalic anhydride, and trimethoxysilyl propyl cyclohexyl dicarboxylic anhydride; and thiol group-containing organosilane compounds such as mercaptopropyl trimethoxysilane, mercaptopropyl triethoxysilane, and mercaptopropyl methyl dimethoxysilane. Two or more of these may be used in combination.

Examples of other organosilane compounds include methyl trimethoxysilane, methyl triethoxysilane, methyl tri (methoxyethoxy)silane, methyl tripropoxysilane, methyl triisopropoxysilane, methyl tributoxysilane, ethyl trimethoxysilane, ethyl triethoxysilane, hexyl trimethoxysilane, octadecyl trimethoxysilane, octadecyl triethoxysilane, 3-aminopropyl triethoxysilane, N-(2-aminoethyl)-3-aminopropyl trimethoxysilane, ethyl tributoxysilane, methyl phenyl dimethoxysilane, cyclohexyl methyl dimethoxysilane, octadecyl methyl dimethoxysilane, tetramethoxysilane, tetraethoxysilane, silanol modified siloxane, and hydrosilane modified siloxane. Two or more of these may be contained together.

In the siloxane resin (A), the hydrocarbon groups having 1 to 30 carbon atoms preferably account for 1 to 80 mol % relative to the total number of moles of $R^1$, $R^2$, and $R^3$. If the hydrocarbon groups having 1 to 30 carbon atoms account for 1 mol % or more relative to the total number of moles of $R^1$, $R^2$, and $R^3$, it will serve to produce a cured siloxane resin composition that is resistant to fracture when bent, and the cured product will have improved flexibility. In addition, as the siloxane backbone increases in flexibility, the crack resistance will further increase. The hydrocarbon groups having 1 to 30 carbon atoms more preferably account for 10 mol % or more relative to the total number of moles of $R^1$, $R^2$, and $R^3$. On the other hand, if the hydrocarbon groups having 1 to 30 carbon atoms account for 80 mol % or less relative to the total number of moles of $R^1$, $R^2$, and $R^3$, the siloxane resin composition will have improved photocurability and thermosetting property and also have further increased adhesiveness and fine pattern processability. The hydrocarbon groups having 1 to 30 carbon atoms more preferably account for 70 mol % or less relative to the total number of moles of $R^1$, $R^2$, and $R^3$.

The content of the hydrocarbon groups having 1 to 30 carbon atoms in the siloxane resin (A) relative to the total number of moles of $R^1$, $R^2$, and $R^3$ can be determined by, for example, examining the siloxane resin (A) using a magnetic nuclear resonance apparatus (for example, AVANCE III HD, manufactured by Bruker Analytics) to measure the $^{29}$Si-magnetic nuclear resonance spectrum of the siloxane resin and calculate the ratio between the peak area attributed to Si atoms bonded to the hydrocarbon groups having 1 to 30 carbon atoms and the peak area attributed to other Si atoms. In addition, the number of carbon atoms present in hydrocarbon groups can be determined by examining the siloxane resin (A) by $^{13}$C-magnetic nuclear resonance to measure the $^{13}$C-magnetic nuclear resonance spectrum of the siloxane resin and examining a deuterochloroform solution of the siloxane resin (A) by $^1$H-magnetic nuclear resonance to measure the $^1$H-magnetic nuclear resonance spectrum of the siloxane resin.

For the siloxane resin (A), a preferably accounts for 3% to 65% relative to the total of a, b, and c. If a accounts for 3% or more relative to the total of a, b, and c, it serves to further improve the adhesiveness. It is more preferable that a accounts for 10% or more relative to the total of a, b, and c. On the other hand, if a accounts for 65% or less relative to the total of a, b, and c, it serves to further improve the photolithographic fine pattern processability. It is more preferable that a accounts for 60% or less relative to the total of a, b, and c.

For the siloxane resin (A), b preferably accounts for 20% to 60% relative to the total of a, b, and c. If b accounts for 20% or more relative to the total of a, b, and c, it serves to allow the crosslinking reaction to progress sufficiently in the radical polymerization step and further improve the photolithographic fine pattern processability. It is more preferable that b accounts for 35% or more. On the other hand, if b accounts for 60% or less relative to the total of a, b, and c, it serves to obtain a finer pattern.

For the siloxane resin (A), c preferably accounts for 5% to 35% relative to the total of a, b, and c. If c accounts for 5% or more relative to the total of a, b, and c, it serves to further improve the photolithographic fine pattern processability. On the other hand, if c accounts for 35% or less relative to the total of a, b, and c, it serves to decrease the film loss rate in the development step.

For the siloxane resin (A), the proportion of a, b, or c relative to the total of a, b, and c can be calculated by, for example, the method described below. First, the $^{29}$Si-magnetic nuclear resonance spectrum of the siloxane resin is measured by the method described above and the ratio between the peak area attributed to Si atoms bonded to X, Y, or Z and the peak area attributed to other Si atoms is calculated. On the other hand, a deuterochloroform solution of the siloxane resin (A) examined by $^1$H-magnetic nuclear resonance to measure the $^1$H-magnetic nuclear resonance spectrum of the siloxane resin (A) and the content of X, Y, or Z in the siloxane resin (A) is calculated from the ratio between the peak area attributed to X, Y, or Z and the peak area attributed to groups other than the silanol group. The proportion of a can be determined from the content of X obtained by combining these results with the $^{29}$Si-magnetic nuclear resonance spectrum observations obtained above, and the proportion of b and the proportion of c are determined from the content of Y and the content of Z, respectively, in a similar way, followed by calculating the proportions of a, b, and c relative to the total.

In the case of a siloxane resin (A) in the form of a product of hydrolysis condensation between an organosilane compound having a structure as represented by general formula (1), a structure as represented by general formula (2), and a structure as represented by general formula (3) and another organosilane compound, the quantity of the another organosilane compound may be decided in an appropriate range unless it impairs the intended characteristics. It is favorable that it accounts for 20% or less relative to the total (100%) of a, b, and c.

There are no specific limitations on the weight average molecular weight of the siloxane resin (A), but it is preferably 10,000 or more and 70,000 or less. Here, the weight average molecular weight of the siloxane resin (A) means the polystyrene based value determined by gel permeation chromatography (GPC).

The siloxane resin (A) can be produced by hydrolysis condensation of an organosilane compound having a structure as represented by general formula (1), a structure as represented by general formula (2), and a structure as represented by general formula (3), and, if required, another organosilane compound. For example, it can be produced by hydrolyzing an organosilane compound and subjecting the resulting silanol compound to a condensation reaction in the presence of a solvent or under solvent-free conditions.

The conditions for the hydrolysis reaction may be set up appropriately taking into consideration the reaction scale, the size and shape of the reaction container, etc. For example, a preferred procedure is adding an acid or basic catalyst and water to an organosilane compound in a solvent over 1 to 180 minutes and then allowing them to react for 1 to 300 minutes in the temperature range from room temperature to 150° C. These conditions for hydrolysis reaction can prevent the reaction from proceeding too rapidly.

It is preferable that the hydrolysis reaction takes place in the presence of an acid catalyst. Preferred acid catalysts include acidic aqueous solutions containing formic acid, acetic acid, or phosphoric acid.

It is preferable that the production of a silanol compound by hydrolysis reaction of an organosilane compound is followed by subjecting the resulting reaction liquid directly to condensation reaction by heating at a temperature of not lower than 50° C. and not higher than the boiling point of the solvent for 1 to 100 hours. In addition, the liquid may be heated again or a basic catalyst may be added in order to increase the polymerization degree of the siloxane resin (A).

Useful solvents for the hydrolysis reaction of an organosilane compound or the condensation reaction of a silanol compound include, for example, alcohols such as methanol, ethanol, propanol, isopropanol, and diacetone alcohol; glycols such as ethylene glycol and propylene glycol; ethers such as ethylene glycol monomethyl ether, ethylene glycol monoethyl ether, propylene glycol monomethyl ether, propylene glycol monoethyl ether, propylene glycol monopropyl ether, propylene glycol monobutyl ether, and ethylene glycol mono-tertiary butyl ether; ketones such as methyl ethyl ketone, acetylacetone, methyl propyl ketone, methyl butyl ketone, methyl isobutyl ketone, diisobutyl ketone, and cyclopentanone; amides such as dimethyl formamide and dimethyl acetamide; acetates such as ethyl acetate, propyl acetate, butyl acetate, isobutyl acetate, ethylene glycol monoethyl ether acetate, propylene glycol monomethyl ether acetate, 3-methoxybutyl acetate, 3-methyl-3-methoxybutyl acetate, methyl lactate, ethyl lactate, and butyl lactate; aromatic or aliphatic hydrocarbons such as toluene, xylene, hexane, and cyclohexane; and others such as γ-butyrolactone, N-methyl-2-pyrrolidone, and dimethyl sulfoxide. Two or more of these may be used in combination. Of these, diacetone alcohol, ethylene glycol mono-tertiary butyl ether, propylene glycol monomethyl ether, propylene glycol monomethyl ether acetate, and propylene glycol monoethyl ether are preferred from the viewpoint of improving the coatability of the siloxane resin composition.

A solvent-free hydrolysis technique may be adopted in the case where a solvent is generated from the hydrolysis reaction. It is also preferable that a solvent is added further after the end of the reaction to adjust the resin composition to an appropriate concentration. To suit particular purposes, furthermore, an appropriate amount of the resulting alcohol may be distilled out and removed by heating and/or reducing the pressure after the hydrolysis reaction, followed by adding an appropriate solvent.

The water used for the hydrolysis reaction is preferably ion-exchanged water.

For the siloxane resin composition according to the present invention, the siloxane resin (A) preferably accounts for 20 mass % or more, more preferably 25 mass % or more, and still more preferably 50 mass % or more, relative to the total solid content excluding the solvent (D). If the siloxane resin (A) accounts for 20 mass % or more, it serves to improve the adhesiveness, reworkability, and resistance to weather and heat. On the other hand, the siloxane resin (A) preferably accounts for 98 parts by mass or less, more preferably 95 parts by mass or less, relative to the total solid content excluding the solvent (D). If the siloxane resin (A) accounts for 98 parts by mass or less, it serves to improve the fine pattern processability.

For the siloxane resin composition according to the present invention, the compound (B) having an unsaturated double bond is a monomer or oligomer having one or more carbon-carbon double bond. There are no specific limitations on the weight average molecular weight of the compound (B) having an unsaturated double bond, but it is preferably 10,000 or less.

Examples of the compound (B) having an unsaturated double bond include methyl acrylate, ethyl acrylate, n-propyl acrylate, isopropyl acrylate, n-butyl acrylate, sec-butyl acrylate, isobutyl acrylate, tert-butyl acrylate, n-pentyl acrylate, allyl acrylate, benzyl acrylate, butoxyethyl acrylate, butoxytriethylene glycol acrylate, cyclohexyl acrylate, dicyclopentanyl acrylate, dicyclopentenyl acrylate, 2-ethylhexyl acrylate, glycerol acrylate, glycidyl acrylate, heptadecafluorodecyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, allylated cyclohexyl diacrylate, 1,4-butanediol diacrylate, 1,3-butylene glycol diacrylate, ethylene glycol diacrylate, diethylene glycol diacrylate, triethylene glycol diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, acrylamide, aminoethyl acrylate, phenyl acrylate, phenoxyethyl acrylate, benzyl acrylate, 1-naphthyl acrylate, 2-naphthyl acrylate, bisphenol A diacrylate, diacrylate of bisphenol A-ethylene oxide adduct, diacrylate of bisphenol A-propylene oxide adduct, 1-vinyl-2-pyrrolidone, N-vinyl-ε-caprolactam, glycidyl acrylate, urethane acrylate, other acrylic esters, thiophenol acrylate, benzyl mercaptan acrylate, monomers produced therefrom by replacing 1 to 5 hydrogen atoms in the aromatic ring with chlorine or bromine atoms, monomers produced therefrom by replacing the acrylate with a methacrylate, styrene, p-methyl styrene, o-methyl styrene, m-methyl styrene, chlorinated styrene, brominated styrene, α-methyl styrene, chlorinated α-methyl styrene, brominated α-methyl styrene, chloromethyl styrene, hydroxymethyl styrene, carboxymethyl styrene, vinyl naphthalene, vinyl anthracene, vinyl carbazole, 2-(1,3,4,5,6,7-hexahydro-1,3-dioxy-2H-isoindole-2-yl) ethyl-2-propenal, N-cyclohexyl maleimide, N-phenyl maleimide, 3,4,5,6-tetrahydrophthalimide, N-acryloyloxyethyl hexahydro phthalimide, N-(2-hydroxyethyl) maleimide, N-vinyl phthalimide, N-allyl phthalimide, 1H-pyrrole-2,5-dione, 1-(3-butenyl)-3,4-dimethyl, 1H-pyrrole-2,5-dione, 3,4-dimethyl-1-(3-methyl-3-butenyl), 2-[2-(2,5-dihydro-3,4-dimethyl-2,5-dioxo-1H-pyrrole-1-yl) ethoxy] ethyl methacrylate, 6-(2,3-dimethyl maleimide) hexyl methacrylate, triallyl isocyanurate, diallyl propyl isocyanurate, trimethacryl isocyanurate, trivinyl isocyanurate, diallyl ethyl maleimide isocyanurate, diallyl-N-allyl acetyl amide isocyanurate, diglycidyl allyl isocyanurate, triglycidyl isocyanurate, diallyl propyl phthalimide isocyanurate, tris-(2-acryloyloxyethyl) isocyanurate, tris-(2-methacryloyloxyethyl) isocyanurate, triallyl propionate isocyanurate, tris-glycidyl pentyl isocyanurate, and tris-glycidyl octyl isocyanurate. Two or more of these may be contained together. In these compound, acrylic groups, methacrylic groups, vinyl groups, maleimide groups, and allyl groups may coexist.

For the siloxane resin composition according to the present invention, the compound (B) having an unsaturated double bond preferably accounts for 1 mass % or more, more preferably 5 mass % or more, relative to the total solid content excluding the solvent (D). If the compound (B) having an unsaturated double bond accounts for 1 mass % or more, it serves to improve the sensitivity and improve the photolithographic fine pattern processability. On the other hand, the compound (B) having an unsaturated double bond preferably accounts for 60 parts by mass or less, more preferably 50 parts by mass or less, relative to the total solid content excluding the solvent (D). If the compound (B) having an unsaturated double bond accounts for 60 parts by mass or less, it serves to improve the fine pattern processability.

For the siloxane resin composition according to the present invention, the photo-initiator (C) may be, for example, a photo-radical polymerization initiator or a photosensitizer. Two or more of these may be contained together.

Specific examples of the photo-initiator (C) include photo-radical polymerization initiators such as oxime ester compounds, acylphosphine oxide compounds, ketone compounds, benzoin compounds, acyloxime compounds, metallocene compounds, thioxanthone compounds, amine compounds, ketone compounds, coumarin compounds, anthracene compound, azo compounds, carbon tetrabromide, and tribromophenyl sulfone; photo cation polymerization initiators such as onium salts, triazine compounds, and boron compounds; and combinations of a photoreducing dye such as eosin and methylene blue and a reduction agent such as ascorbic acid and triethanol amine.

For the siloxane resin composition according to the present invention, the photo-initiator (C) preferably accounts for 0.1 mass % or more, more preferably 0.2 mass % or more, relative to the total solid content excluding the solvent (D). If the photo-initiator (C) accounts for 0.1 mass % or more, the light-exposed portion of the siloxane resin composition will have a high curing density to ensure a high residual film rate after the development step. On the other hand, the photo-initiator (C) preferably accounts for 20 parts by mass or less, more preferably 10 parts by mass or less, relative to the total solid content excluding the solvent (D). If the photo-initiator (C) accounts for 20 parts by mass or less, it will be easy to control the sensitivity to ensure a high fine pattern processability.

For the siloxane resin composition according to the present invention, the solvent (D) is preferably an organic solvent that can dissolve the siloxane resin (A), the compound (B) having an unsaturated double bond, and the photo-initiator (C). Examples include alcohols such as ethanol, propanol, isopropanol, and diacetone alcohol; glycols such as ethylene glycol and propylene glycol; ethers such as ethylene glycol monomethyl ether, ethylene glycol monoethyl ether, propylene glycol monomethyl ether, propylene glycol monoethyl ether, propylene glycol monopropyl ether, and propylene glycol monobutyl ether; ketones such as methyl ethyl ketone, acetylacetone, methyl propyl ketone, methyl butyl ketone, methyl isobutyl ketone, diisobutyl ketone, and cyclopentanone; amides such as dimethyl formamide and dimethyl acetamide; acetates such as ethyl acetate, propyl acetate, butyl acetate, isobutyl acetate, ethylene glycol monoethyl ether acetate, propylene glycol monomethyl ether acetate, 3-methoxybutyl acetate, 3-methyl-3-methoxybutyl acetate, methyl lactate, ethyl lactate, and butyl lactate; aromatic or aliphatic hydrocarbons such as toluene, xylene, hexane, and cyclohexane; and others such as γ-butyrolactone, N-methyl-2-pyrrolidone, and dimethyl sulfoxide. Two or more of these may be contained together.

For the siloxane resin composition according to the present invention, the solvent (D) preferably accounts for 10 to 80 mass %.

The siloxane resin composition according to the present invention preferably contains a photoacid generator. A photoacid generator is a compound that generates an acid as a result of bond cleavage that occurs when exposed to light and the compound preferably one that generates an acid when exposed to a ray having a wavelength of 365 nm (i-line), 405 nm (h-line), or 436 nm (g-line) or a mixture thereof. The acid acts as a catalyst to promote the dehydration condensation of silanol. When the siloxane resin composition contains a compound having a cyclic ether group, the acid acts as a polymerization catalyst for the cyclic ether group.

The existence of an acid after the light exposure step serves to promote the condensation of unreacted silanol groups and/or polymerization of cyclic ether groups to ensure a decreased film loss rate during the development step. The acid to be generated is preferably a strong acid such as perfluoroalkyl sulfonic acid and p-toluene sulfonic acid.

Examples of the photoacid generator include, SI-100, SI-101, SI-105, SI-106, SI-109, PI-105, PI-106, PI-109, NAI-100, NAI-1002, NAI-1003, NAI-1004, NAI-101, NAI-105, NAI-106, NAI-109, NDI-101, NDI-105, NDI-106, NDI-109, PAI-01, PAI-101, PAI-106, and PAI-1001 (all trade names, manufactured by Midori Kagaku Co., Ltd.), SP-077 and SP-082 (both trade names, manufactured by Adeka Corporation), TPS-PFBS (trade name, manufactured by Toyo Gosei Co., Ltd.), CGI-MDT and CGI-NIT (both trade names, manufactured by Ciba Japan K.K.), and WPAG-281, WPAG-336, WPAG-339, WPAG-342, WPAG-344, WPAG-350, WPAG-370, WPAG-372, WPAG-449, WPAG-469, WPAG-505, and WPAG-506 (all trade names, manufactured by Wako Pure Chemical Industries, Ltd.). Two or more of these may be contained together. Of these, CGI-MDT is preferred.

From the viewpoint of decreasing the film loss rate and enhancing the developability, the photoacid generator in the siloxane resin composition preferably accounts for 0.5 mass % or more and preferably 2.0 mass % or less, of the solid content.

The siloxane resin composition according to the present invention may contain other additives than the components of (A) to (D) unless they impair the intended characteristics (commonly, altogether accounting for 5 mass % or less of the total solid content). Such additives include, for example, compounds having no unsaturated double bonds in the molecule, plasticizer, leveling agent, thermal acid generator, curing agent, surface active agent, silane coupling agent, antifoam agent, and pigment.

The siloxane resin composition according to the present invention preferably has a viscosity at 25° C. of 1 to 1,000 mPa·s. A viscosity at 25° C. of 1 mPa·s or more ensures a uniform coating film thickness. A viscosity at 25° C. of 1,000 mPa·s or less, on the other hand, permits the use of a discharge type coating apparatus for coating to ensure quick coating of a large area, thereby achieving high coatability. The viscosity at 25° C. is more preferably 100 mPa·s or less. Here, the viscosity of the siloxane resin composition according to the present invention can be determined from viscosity measurements taken by using a type E viscometer (for example, TV25 Viscometer, manufactured by Toki Sangyo Co., Ltd.) after maintaining the specimen under the conditions of a temperature of 25° C. and a rotating speed of 20 rpm for one minute. To control the viscosity at 25° C. of the siloxane resin composition according to the present invention in the aforementioned range, a good method is, for example, to adjust the content of the solvent (D) and the weight average molecular weight of the siloxane resin (A) of the siloxane resin composition to the aforementioned preferable range.

The siloxane resin composition according to the present invention can be prepared by mixing the components of (A) to (D) and, if required, other components. It is preferable to use a stirrer to mix and dissolve these components. Good stirrers include, for example, stirring-shaking devices such as shaker and mixer.

Next, the adhesive according to the present invention is described below. The adhesive according to the present invention contains the aforementioned siloxane resin composition, and the adhesive serves to bond and fix a plurality of adherends. For purposes of the present invention, the term "adhesion" means the bonding of a plurality of adherend surfaces via a chemical bond, physical bond and/or mechanical bond that is formed as a result of providing an adhesive between them. The adhesive according to the present invention permits micron-level fine processing of the cured product in terms of the film thickness, pattern line width, and pattern interval without using special processing tools, thereby making contributions to shortened production tact and fine processing in steps for fabrication of small electronic instruments.

A cured product can be obtained by curing the siloxane resin composition according to the present invention. The siloxane resin composition according to the present invention contains a siloxane resin having a flexible backbone and therefore can serve to produce a cured product with a film thickness of 10 μm to 200 μm. Such a cured product can work suitably as an adhesive. A method to prepare a cured product (adhesive) through pattern processing of a siloxane resin composition is described below with reference to examples.

The siloxane resin composition according to the present invention is preferably spread over a substrate, followed by drying, light exposure, and development to form a fine pattern having adhesiveness. Here, the substrate is one of the adherends.

Examples of the substrate include glass substrate, silicon wafer, alumina substrate, aluminum nitride substrate, silicon carbide substrate, decorative layered substrate, insulation layered substrate, polyethylene terephthalate (hereinafter PET) film, other polyester film, polyimide film, aramid film, epoxy resin substrate, polyetherimide resin substrate, polyether ketone resin substrate, and polysulfone based resin substrate.

To spread the siloxane resin composition over a substrate, good coating methods include, for example, gravure printing, spin coating, slit coating, bar coating, spray coating, and screen printing.

The resulting coating film is preferably dried to remove the solvent by evaporation. Useful drying methods include heating, vacuum drying, and infrared drying. Useful heated-air drying instruments include, for example, oven, hot plate, and infrared ray radiation apparatus. The heating temperature is preferably 60° C. to 120° C. A drying temperature of 60° C. or more serves for complete evaporation and removal of the solvent. A drying temperature of 120° C. or less, on the other hand, serves for suppressing the thermal crosslinking in the siloxane resin composition, thereby ensuring a decrease in the residue in the unexposed portions. The heating time minute is preferably 1 to 60 minutes.

Then, the dried film obtained in the drying step is preferably exposed to light and developed. For light exposure, a common method is to expose the film to light through a photomask, but another good method is to use a laser etc. to perform direct drawing without using a photomask. Good light exposure instruments include, for example, stepper and aligner. Actinic rays useful for the light exposure step include near ultraviolet ray, ultraviolet ray, electron beam, X-ray, and laser beam, of which ultraviolet ray is preferred. Useful sources of ultraviolet ray include, for example, low pressure mercury lamp, high pressure mercury lamp, ultra-high pressure mercury lamp, halogen lamp, sterilization lamp, of which high pressure mercury lamp is preferred.

The light-exposed film is then developed with a developer, which dissolves and removes the unexposed portions to form an intended fine pattern. Useful developers include alkaline developers and organic developers. Good alkaline developers include, for example, aqueous solutions of tetramethyl ammonium hydroxide, diethanol amine, diethyl aminoethanol, sodium hydroxide, potassium hydroxide, sodium carbonate, potassium carbonate, triethyl amine, diethyl amine, methyl amine, dimethyl amine, dimethylaminoethyl acetate, dimethylaminoethanol, dimethylaminoethyl methacrylate, cyclohexyl amine, ethylene diamine, and hexamethylene diamine. A surface active agent may be added thereto. Good organic developers include, for example, polar solvents such as N-methyl-2-pyrrolidone, N-acetyl-2-pyrrolidone, N,N-dimethyl acetamide, N,N-dimethyl formamide, dimethyl sulfoxide, and hexamethyl phosphortriamide. These polar solvents may contain methanol, ethanol, isopropyl alcohol, xylene, water, methyl carbitol, ethyl carbitol, etc.

Useful development methods include, for example, to spray a developer over the surface of a light-exposed film laid on a stationary or rotating substrate, immerse a substrate carrying a light-exposed film laid thereon in a developer, and apply ultrasonic waves to a substrate carrying a light-exposed film laid thereon immersed in a developer.

The pattern formed in the development step may be rinsed with a rinsing liquid. Good rinsing liquids include, for example, water, aqueous solutions of alcohols, and aqueous solutions of esters. Useful alcohols include, for example, ethanol and isopropyl alcohol. Useful esters include, for instance, ethyl lactate and propylene glycol monomethyl ether acetate.

After forming an adhesive fine pattern on a substrate by one of the aforementioned methods, the other adherend is put thereon and heated to allow the substrate, i.e., the first adherend, to be adhered and fixed to the other adherend. The heating is preferably performed under the conditions of 50° C. to 200° C. and 1 to 60 minutes.

Cured products produced by curing the siloxane resin composition according to the present invention can be used suitably for assembling display devices, semiconductor devices, lighting devices, etc. For assembling display devices, for example, a cured product produced by curing the siloxane resin composition according to the present invention is used as an adhesive to adhere a substrate to at least one selected from the group consisting of liquid crystal cell, organic EL, mini-LED cell, and micro-LED cell. A mini-LED cell contains an array of many LED units each with lengthwise and breadthwise sizes of about 100 μm to 10 mm. A micro-LED cell contains an array of many LED units each with lengthwise and breadthwise sizes of less than 100 μm. For assembling semiconductor devices for image sensors, a cured product produced by curing the siloxane resin composition according to the present invention is used as an adhesive to adhere a ceramic package to a glass lid having an optical coat. For assembling LED lighting devices, furthermore, a cured product produced by curing the siloxane resin composition according to the present invention can be used suitably as an adhesive to adhere an LED element to a lead frame substrate.

As an example, described below is a method to produce a display panel type display device using an adhesive prepared from the siloxane resin composition according to the present invention.

First, a display panel containing liquid crystal cells etc. is adhered to components such as backlight units with an adhesive prepared from the siloxane resin composition according to the present invention and, after assemblage, a driving circuit is incorporated. A display panel type display device contains various parts including, for example, diffusion plate, light guide plate, antiglare layer, index matching layer, antireflection layer, protective insulation layer, lens array sheet, backlight unit, and touch sensor module, which may be laid in a single or more layered structure as required.

EXAMPLES

Hereinafter, the present invention will be described in more detail referring to examples and comparative examples, but the present invention is not limited thereto. The materials and evaluation methods used in each example and comparative example were as described below.

<Materials for Siloxane Resin (A)>

Organosilane compound (a-X1): vinyl trimethoxysilane (manufactured by Tokyo Chemical Industry Co., Ltd.)

Organosilane compound (a-X2): octenyl trimethoxysilane (manufactured by Tokyo Chemical Industry Co., Ltd.)

Organosilane compound (a-X3): oxetanyl trimethoxysilane (manufactured by Toagosei Co., Ltd.)

Organosilane compound (a-X4): 3-glycidyloxypropyl trimethoxysilane (manufactured by Tokyo Chemical Industry Co., Ltd.)

Organosilane compound (a-X5): glycidyloxyoctyl trimethoxysilane (manufactured by Tokyo Chemical Industry Co., Ltd.)

Organosilane compound (a-X6): 3-isocyanate propyl triethoxysilane (manufactured by Tokyo Chemical Industry Co., Ltd.)

Organosilane compound (a-X7): 3-glycidyloxypropyl methyl dimethoxysilane (manufactured by Tokyo Chemical Industry Co., Ltd.)

Organosilane compound (b-Y1): 3-acryloyloxypropyl trimethoxysilane (manufactured by Tokyo Chemical Industry Co., Ltd.)
Organosilane compound (b-Y2): 3-methacryloyloxypropyl trimethoxysilane (manufactured by Tokyo Chemical Industry Co., Ltd.)
Organosilane compound (b-Y3): 3-acryloyloxypropyl methyl dimethoxysilane (manufactured by Tokyo Chemical Industry Co., Ltd.)
Organosilane compound (b-Y4): 3-methacryloyloxypropyl methyl dimethoxysilane (manufactured by Tokyo Chemical Industry Co., Ltd.)
Organosilane compound (c-Z1): 3-trimethoxysilyl propyl succinic anhydride (manufactured by Tokyo Chemical Industry Co., Ltd.)
Organosilane compound (c-Z2): 3-mercaptopropyl trimethoxysilane (manufactured by Tokyo Chemical Industry Co., Ltd.)
Organosilane compound (d-1): methyl trimethoxysilane (manufactured by Tokyo Chemical Industry Co., Ltd.)
Organosilane compound (d-2): hexyl trimethoxysilane (manufactured by Shin-Etsu Chemical Co., Ltd.)
Organosilane compound (d-3): methyl phenyl dimethoxysilane (manufactured by Shin-Etsu Chemical Co., Ltd.)
Organosilane compound (d-4): silanol modified siloxane oligomer X-21-5841 (trade name, manufactured by Shin-Etsu Chemical Co., Ltd.)
Organosilane compound (d-5): hydrosilane modified siloxane oligomer TSL9586 (trade name, manufactured by Momentive Performance Materials Japan)
Polymerization inhibitor: 2,6-di-tert-butyl-p-cresol (manufactured by Tokyo Chemical Industry Co., Ltd.)
Polymerization catalyst: phosphoric acid (manufactured by Tokyo Chemical Industry Co., Ltd.) Solvent: propylene glycol monomethyl ether acetate (hereinafter PGMEA) (manufactured by Tokyo Chemical Industry Co., Ltd.)
<Materials for Siloxane Resin Composition>
Compound (B) having an unsaturated double bond: isobutyl acrylate (manufactured by Tokyo Chemical Industry Co., Ltd.)
Photo-initiator (C): diphenyl ketone (manufactured by Tokyo Chemical Industry Co., Ltd.)
Solvent (D): PGMEA (manufactured by Tokyo Chemical Industry Co., Ltd.)
Leveling agent: BYK (registered trademark)-333 (manufactured by BYK-Chemie Japan)
The evaluation methods used for each example and comparative example are described below.
(1) Viscosity
The viscosity of the siloxane resin composition prepared in each Example and Comparative example was determined from viscosity measurements taken by using a type E viscometer after maintaining the specimen under the conditions of a temperature of 25° C. and a rotating speed of 20 rpm for one minute.
(2) Coatability
The coatability of the siloxane resin composition prepared in each Example and Comparative example was evaluated according to the criteria given below on the basis of whether the specimen suffered from defective coating in the coating step. Here, defective coating means a state where the coating liquid suffers from any of the following: clogging of the nozzle, uneven film thickness, and coating defect.
Free of defective coating: A
Suffering from defective coating: B (3) Fine Pattern Processability
Two film samples with adhesion patterns having different pattern width/pattern interval (hereinafter L/S) ratios that were prepared in each Example and Comparative example were observed under an optical microscope at a magnification of 50 times for defective pattern formation and the pattern processability was evaluated according to the criteria given below. Here, defective pattern formation means a state where the specimen suffers from at least either removal of the pattern from the PET film or occurrence of residue between patterns.
Defective pattern formation not present in the base surface: A
Defective pattern formation present in the base surface: B
(4) Adhesiveness
A glass substrate (OA-10 G, manufactured by Nippon Electric Glass Co., Ltd.) was put on the film having an adhesive pattern prepared in each Example and Comparative example and they were combined together and heated on a hot plate at 120° C. for 30 minutes to produce a film having a glass substrate. This film having a glass substrate was cut to a width of 25 mm and a length of 100 mm and peeled by a tensile testing machine (EZ-SX, manufactured by Shimadzu Corporation) at a peeling angle of 90° and a peeling speed of 300 mm/min to determine the adhesive strength (N/25 mm).
(5) Flexibility of Cured Product
A PET film was put on the film having an adhesive layer prepared in each Example and Comparative example and they were combined together and heated on a hot plate at 120° C. for 30 minutes to produce a film having a cured product. This film having a cured product was cut to a width of 10 mm and a length of 100 mm and set in an endurance testing machine (DLDMLH-FU, manufactured by Yuasa System Co., Ltd.) so as to allow the surface of the cured product to face itself, followed by carrying out sheet type U-shape folding test under the condition of a bending radius R of 5 mm. After repeating this test 100, 500, 1,000, or 5,000 times, the cured product was observed under an optical microscope at a magnification of 50 times to check for damage, and the flexibility of the cured product was evaluated according to the criteria given below. Here, damage to the cured product means a state where it suffers from at least one of the following: cracking, breakage, and separation between the base and the adherend.
Damage to the cured product not found: A
Damage to the cured product found: B.
(6) Crack Resistance
The siloxane resin composition prepared in each Example and Comparative example was spread over a 10 cm×10 cm non-alkali glass substrate in such a manner that the film, after being cured, would have a thickness of 10 μm or 30 μm, and then prebaked on a hot plate (SCW-636) at a temperature of 100° C. for 3 minutes to prepare a prebaked film. Subsequently, a parallel light mask aligner (PLA-501F (trade name), manufactured by Canon Inc.) was used with an ultrahigh pressure mercury lamp as light source to expose the prebaked film to light to an exposure of 300 mJ/cm² without using a mask. Subsequently, using an automatic development apparatus (AD-2000 (trade name), manufactured by Takizawa Sangyo Co., Ltd.), shower development was performed for 60 seconds using an aqueous potassium hydroxide solution with a concentration of 0.045 wt %, followed by rinsing with water for 30 seconds. In addition, the film was cured in air at a temperature of 200° C. for 30 minutes using an oven (trade name IHPS-222, manufactured by Espec Corp.) to prepare a cured product. The resulting cured product was observed visually and examined for cracks to make evaluations according to the criteria given below. Here, it is judged not to have crack resistance at the film thickness if at least one crack is found.
Cracking in the cured product not found: A
Cracking in the cured product found: B
(7) Film Loss During Development
The siloxane resin composition prepared in each Example and Comparative example was spread over a silicon wafer substrate and then it was prebaked, exposed to light, and developed as in paragraph (6), which describes the crack resistance evaluation method. The film thickness was measured after the prebaking step and the development step and the film loss during development was evaluated by the equation given below.

Film loss during development(%)=((film thickness after prebaking)−(film thickness after development))×100/(film thickness after prebaking)

Synthesis Example 1

In a glass flask, the organosilane compound (a-X1), organosilane compound (b-Y1), and organosilane compound (c-Z1) listed in Table 1 were weighed out in such amounts as to account for the mole percentages given in Table 1 and altogether measure 0.1 mole, and then 0.21 g of a polymerization inhibitor and 205.47 g of a solvent were added, followed by stirring at 40° C. for 30 minutes. Subsequently, 1 mass % of an aqueous phosphoric acid solution relative to the total weight, which accounts for 100 mass %, of the organosilane compounds was added over 10 minutes and, after the addition, they were stirred for 30 minutes and further stirred at 70° C. for 30 minutes. While evaporating the methanol by-product and water, stirring was continued at 120° C. for 3 hours to provide a PGMEA solution of the siloxane resin A1, which corresponds to the siloxane resin (A).

The $^{29}$Si-magnetic nuclear resonance spectrum and the $^{1}$H-magnetic nuclear resonance spectrum of the resulting siloxane resin A1 were examined to determine the proportion of the hydrocarbon groups having 1 to 30 carbon atoms to the total number of moles of $R^1$, $R^2$, and $R^3$ and the proportions of a, b, and c to the total of a, b, and c. The resulting siloxane resin A1 was examined by GPC performed at a developing speed of 0.4 ml/min using tetrahydrofuran as eluent, and the weight average molecular weight was found to be 20,000 in terms of polystyrene. These results are given in Table 1.

Synthesis Examples 2 to 27

Except for adopting the type and mass of organosilane compounds as specified in Tables 1 and 2 to constitute a siloxane resin and performing polymerization for a specified period, the same procedure as in Synthesis example 1 was carried out to prepare siloxane resins A2 to A24, which correspond to the siloxane resin (A), and A'25 to A'27, which do not correspond to the siloxane resin (A). The same procedure as in Synthesis example 1 was carried out to determine the proportion of the hydrocarbon groups having 1 to 30 carbon atoms to the total number of moles of $R^1$, $R^2$, and $R^3$, the proportions of a, b, and c to the total of a, b, and c, and the weight average molecular weight, and the results obtained are given in Table 1 to 2.

TABLE 1

| | | Synthesis example 1 | Synthesis example 2 | Synthesis example 3 | Synthesis example 4 | Synthesis example 5 | Synthesis example 6 |
|---|---|---|---|---|---|---|---|
| Siloxane resin | | A1 | A2 | A3 | A4 | A5 | A6 |
| Feeding ratio for synthesis (mol %) | a-X1 | 1 | 80 | 0 | 40 | 40 | 0 |
| | a-X2 | 0 | 0 | 0 | 0 | 0 | 40 |
| | a-X3 | 0 | 0 | 0 | 0 | 0 | 0 |
| | a-X4 | 0 | 0 | 80 | 0 | 0 | 0 |
| | a-X5 | 0 | 0 | 0 | 0 | 0 | 0 |
| | a-X6 | 0 | 0 | 0 | 0 | 0 | 0 |
| | a-X7 | 0 | 0 | 0 | 0 | 0 | 0 |
| | b-Y1 | 64 | 15 | 15 | 40 | 40 | 40 |
| | b-Y2 | 0 | 0 | 0 | 0 | 0 | 0 |
| | b-Y3 | 0 | 0 | 0 | 0 | 0 | 0 |
| | b-Y4 | 0 | 0 | 0 | 0 | 0 | 0 |
| | c-Z1 | 35 | 5 | 5 | 20 | 20 | 20 |
| | c-Z2 | 0 | 0 | 0 | 0 | 0 | 0 |
| | d-1 | 0 | 0 | 0 | 0 | 0 | 0 |
| | d-2 | 0 | 0 | 0 | 0 | 0 | 0 |
| | d-3 | 0 | 0 | 0 | 0 | 0 | 0 |
| | d-4 | 0 | 0 | 0 | 0 | 0 | 0 |
| | d-5 | 0 | 0 | 0 | 0 | 0 | 0 |
| Polymerization period (h) | | 3 | 3 | 3 | 10 | 3 | 3 |
| Weight average molecular weight | | 20,000 | 20,000 | 20,000 | 100,000 | 20,000 | 20,000 |
| Proportion of hydrocarbon groups to total number of moles of $R^1$, $R^2$, and $R^3$ (%) | | 0 | 0 | 0 | 0 | 0 | 0 |
| Proportion of a to total of a, b, and c (%) | | 1 | 80 | 80 | 40 | 40 | 40 |
| Proportion of b to total of a, b, and c (%) | | 64 | 15 | 15 | 40 | 40 | 40 |

TABLE 1-continued

| | | | | | | |
|---|---|---|---|---|---|---|
| Proportion of c to total of a, b, and c (%) | 35 | 5 | 5 | 20 | 20 | 20 |
| Number of carbon atoms in X | 2 | 2 | 6 | 2 | 2 | 8 |

| | | Synthesis example 7 | Synthesis example 8 | Synthesis example 9 | Synthesis example 10 | Synthesis example 11 | Synthesis example 12 |
|---|---|---|---|---|---|---|---|
| Siloxane resin | | A7 | A8 | A9 | A10 | A11 | A12 |
| Feeding ratio for synthesis (mol %) | a-X1 | 0 | 0 | 0 | 0 | 40 | 40 |
| | a-X2 | 0 | 0 | 0 | 0 | 0 | 0 |
| | a-X3 | 40 | 0 | 0 | 0 | 0 | 0 |
| | a-X4 | 0 | 40 | 0 | 0 | 0 | 0 |
| | a-X5 | 0 | 0 | 40 | 0 | 0 | 0 |
| | a-X6 | 0 | 0 | 0 | 40 | 0 | 0 |
| | a-X7 | 0 | 0 | 0 | 0 | 0 | 0 |
| | b-Y1 | 40 | 40 | 40 | 40 | 0 | 40 |
| | b-Y2 | 0 | 0 | 0 | 0 | 40 | 0 |
| | b-Y3 | 0 | 0 | 0 | 0 | 0 | 0 |
| | b-Y4 | 0 | 0 | 0 | 0 | 0 | 0 |
| | c-Z1 | 20 | 20 | 20 | 20 | 20 | 0 |
| | c-Z2 | 0 | 0 | 0 | 0 | 0 | 20 |
| | d-1 | 0 | 0 | 0 | 0 | 0 | 0 |
| | d-2 | 0 | 0 | 0 | 0 | 0 | 0 |
| | d-3 | 0 | 0 | 0 | 0 | 0 | 0 |
| | d-4 | 0 | 0 | 0 | 0 | 0 | 0 |
| | d-5 | 0 | 0 | 0 | 0 | 0 | 0 |
| Polymerization period (h) | | 3 | 3 | 3 | 3 | 3 | 3 |
| Weight average molecular weight | | 20,000 | 20,000 | 20,000 | 20,000 | 20,000 | 20,000 |
| Proportion of hydrocarbon groups to total number of moles of $R^1$, $R^2$, and $R^3$ (%) | | 0 | 0 | 0 | 0 | 0 | 0 |
| Proportion of a to total of a, b, and c (%) | | 40 | 40 | 40 | 40 | 40 | 40 |
| Proportion of b to total of a, b, and c (%) | | 40 | 40 | 40 | 40 | 40 | 40 |
| Proportion of c to total of a, b, and c (%) | | 20 | 20 | 20 | 20 | 20 | 20 |
| Number of carbon atoms in X | | 9 | 6 | 11 | 4 | 2 | 2 |

TABLE 2

| | | Synthesis example 13 | Synthesis example 14 | Synthesis example 15 | Synthesis example 16 | Synthesis example 17 | Synthesis example 18 |
|---|---|---|---|---|---|---|---|
| siloxane resin | | A13 | A14 | A15 | A16 | A17 | A18 |
| Feeding ratio for synthesis (mol %) | a-X1 | 5 | 60 | 35 | 35 | 35 | 35 |
| | a-X2 | 0 | 0 | 0 | 0 | 0 | 0 |
| | a-X3 | 0 | 0 | 0 | 0 | 0 | 0 |
| | a-X4 | 0 | 0 | 0 | 0 | 0 | 0 |
| | a-X5 | 0 | 0 | 0 | 0 | 0 | 0 |
| | a-X6 | 0 | 0 | 0 | 0 | 0 | 0 |
| | a-X7 | 0 | 0 | 0 | 0 | 0 | 0 |
| | b-Y1 | 60 | 30 | 35 | 35 | 35 | 35 |
| | b-Y2 | 0 | 0 | 0 | 0 | 0 | 0 |
| | b-Y3 | 0 | 0 | 0 | 0 | 0 | 0 |
| | b-Y4 | 0 | 0 | 0 | 0 | 0 | 0 |
| | c-Z1 | 35 | 10 | 20 | 20 | 20 | 20 |
| | c-Z2 | 0 | 0 | 0 | 0 | 0 | 0 |
| | d-1 | 0 | 0 | 10 | 0 | 0 | 0 |
| | d-2 | 0 | 0 | 0 | 10 | 0 | 0 |
| | d-3 | 0 | 0 | 0 | 0 | 10 | 0 |
| | d-4 | 0 | 0 | 0 | 0 | 0 | 10 |
| | d-5 | 0 | 0 | 0 | 0 | 0 | 0 |

TABLE 2-continued

| | | | | | | |
|---|---|---|---|---|---|---|
| polymerization hours (h) | 3 | 3 | 3 | 3 | 3 | 3 |
| weight average molecular weight | 20,000 | 20,000 | 20,000 | 20,000 | 20,000 | 50,000 |
| Proportion of hydrocarbon groups to total number of moles of $R^1$, $R^2$, and $R^3$ (%) | 0 | 0 | 0 | 0 | 10 | 30 |
| Proportion of a to total of a, b, and c (%) | 5 | 60 | 35 | 35 | 35 | 35 |
| Proportion of b to total of a, b, and c (%) | 60 | 30 | 35 | 35 | 35 | 35 |
| Proportion of c to total of a, b, and c (%) | 35 | 10 | 20 | 20 | 20 | 20 |
| Number of carbon atoms in X | 2 | 2 | 2 | 2 | 2 | 2 |

| | | Synthesis example 19 | Synthesis example 20 | Synthesis example 21 | Synthesis example 22 |
|---|---|---|---|---|---|
| siloxane resin | | A19 | A20 | A21 | A22 |
| Feeding ratio for synthesis (mol %) | a-X1 | 35 | 0 | 40 | 40 |
| | a-X2 | 0 | 0 | 0 | 0 |
| | a-X3 | 0 | 0 | 0 | 0 |
| | a-X4 | 0 | 0 | 0 | 0 |
| | a-X5 | 0 | 0 | 0 | 0 |
| | a-X6 | 0 | 0 | 0 | 0 |
| | a-X7 | 0 | 40 | 0 | 0 |
| | b-Y1 | 35 | 40 | 0 | 0 |
| | b-Y2 | 0 | 0 | 0 | 0 |
| | b-Y3 | 0 | 0 | 40 | 0 |
| | b-Y4 | 0 | 0 | 0 | 40 |
| | c-Z1 | 20 | 20 | 20 | 20 |
| | c-Z2 | 0 | 0 | 0 | 0 |
| | d-1 | 0 | 0 | 0 | 0 |
| | d-2 | 0 | 0 | 0 | 0 |
| | d-3 | 0 | 0 | 0 | 0 |
| | d-4 | 0 | 0 | 0 | 0 |
| | d-5 | 10 | 0 | 0 | 0 |
| polymerization hours (h) | | 3 | 3 | 3 | 3 |
| weight average molecular weight | | 40,000 | 20,000 | 20,000 | 20,000 |
| Proportion of hydrocarbon groups to total number of moles of $R^1$, $R^2$, and $R^3$ (%) | | 30 | 40 | 40 | 40 |
| Proportion of a to total of a, b, and c (%) | | 35 | 40 | 40 | 40 |
| Proportion of b to total of a, b, and c (%) | | 35 | 40 | 40 | 40 |
| Proportion of c to total of a, b, and c (%) | | 20 | 20 | 20 | 20 |
| Number of carbon atoms in X | | 2 | 7 | 2 | 2 |

| | | Synthesis example 23 | Synthesis example 24 | Synthesis example 25 | Synthesis example 26 | Synthesis example 27 |
|---|---|---|---|---|---|---|
| Siloxane resin | | A23 | A24 | A'25 | A'26 | A'27 |
| Feeding ratio for synthesis (mol %) | a-X1 | 20 | 0 | 1 | 0 | 0 |
| | a-X2 | 0 | 0 | 0 | 0 | 0 |
| | a-X3 | 0 | 0 | 0 | 0 | 0 |
| | a-X4 | 0 | 0 | 0 | 0 | 30 |
| | a-X5 | 0 | 20 | 0 | 0 | 0 |
| | a-X6 | 0 | 0 | 0 | 0 | 0 |
| | a-X7 | 0 | 0 | 0 | 0 | 0 |
| | b-Y1 | 0 | 35 | 0 | 60 | 40 |
| | b-Y2 | 0 | 0 | 0 | 0 | 0 |

TABLE 2-continued

| | | | | | |
|---|---|---|---|---|---|
| b-Y3 | 65 | 0 | 0 | 0 | 0 |
| b-Y4 | 0 | 0 | 0 | 0 | 0 |
| c-Z1 | 15 | 15 | 5 | 20 | 0 |
| c-Z2 | 0 | 0 | 0 | 0 | 0 |
| d-1 | 0 | 0 | 94 | 20 | 30 |
| d-2 | 0 | 20 | 0 | 0 | 0 |
| d-3 | 0 | 0 | 0 | 0 | 0 |
| d-4 | 0 | 0 | 0 | 0 | 0 |
| d-5 | 0 | 10 | 0 | 0 | 0 |
| Polymerization hours (h) | 3 | 3 | 3 | 3 | 3 |
| Weight average molecular weight | 20,000 | 20,000 | 20,000 | 20,000 | 20,000 |
| Proportion of hydrocarbon groups to total number of moles of $R^1$, $R^2$, and $R^3$ (%) | 65 | 10 | 0 | 0 | 0 |
| Proportion of a to total of a, b, and c (%) | 20 | 20 | 1 | 0 | 30 |
| Proportion of b to total of a, b, and c (%) | 65 | 35 | 0 | 60 | 40 |
| Proportion of c to total of a, b, and c (%) | 15 | 15 | 5 | 20 | 0 |
| Number of carbon atoms in X | 2 | 11 | 2 | 0 | 6 |

Example 1

In a vial bottle, the siloxane resin A1 prepared in Synthesize example 1, the compound (B) having an unsaturated double bond, the photo-initiator (C), and a leveling agent were added so that they accounted for 80 mass %, 19 mass %, 0.9 mass %, and 0.1 mass % in terms of solid content, respectively, and the solvent (D) was added so that the total solid content was 40 mass %, followed by stirring at room temperature for 30 minutes to provide a siloxane resin composition S1. The viscosity of this siloxane resin composition was measured by the aforementioned method and found to be 10 mPa·s.

Using a slit die coater (multi-unit coater, manufactured by Toray Engineering Co., Ltd.), the siloxane resin composition 51 was spread over a PET film (Lumirror (registered trademark) S-10, manufactured by Toray Industries, Inc.) by the slit coating technique to form a coating film. The coatability was evaluated by the aforementioned method and rated as A.

The resulting coating film was dried on a hot plate at 100° C. for 3 minutes and a film P1 having a dried film with a film thickness of 10 μm was obtained after the drying. The same procedure was carried out repeatedly to provide a plurality of films P1 each having a dried film. Each film P1 having a dried film was exposed to light under the condition of a dose of 300 mJ/cm² (assumed wavelength 365 nm) from an ultrahigh pressure mercury lamp with an output of 21 mW/cm² through either of two exposure masks each having a pattern with a L/S of 100/100 μm or 20 μm/20 μm to provide a patterned light-exposed film P1. Elsewhere, an entirely light-exposed film P1 was prepared by applying light without using an exposure mask. Subsequently, using a 0.045 mass % aqueous potassium hydroxide solution as developer, shower development was performed until the unexposed portions of the patterned light-exposure film P1 were entirely dissolved to provide a film P1 having an adhesive pattern. The entirely light-exposed film P1 was developed for the same development period to provide a film P1 having an adhesive layer. Films P1 each having an adhesive pattern with an L/S of 100/100 μm or an L/S of 20 μm/20 μm were examined for fine pattern processability by the aforementioned method and both were rated as A. The adhesiveness of the films P1 each having an adhesive pattern was measured by the aforementioned method and found to be 2 N/25 mm. The flexibility of the cured films P1 each having an adhesive layer was evaluated by the aforementioned method and rated as A in the case of 100 times of bending and B in the case of 500 times of bending.

Examples 2 to 24 and Comparative Examples 1 to 3

Except for using siloxane resins as specified in Tables 3 and 4, the same procedure as in Example 1 was carried out to prepare siloxane resin compositions S2 to S24 and S28 to S30. Except for using the siloxane resin compositions S2 to S24 and S28 to S30 specified in Tables 3 and 4 instead of the siloxane resin composition S1, the same procedure as in Example 1 was carried out to prepare films P2 to 24 and P28 to 30 each having an adhesive pattern and films P2 to 24 and P28 to 30 each having an adhesive layer. Results of evaluation performed by the aforementioned method are given in Tables 3 and 4.

Example 25

In a vial bottle, the siloxane resin A24 prepared in Synthesize example 24, the compound (B) having an unsaturated double bond, the photo-initiator (C), the photoacid generator (E), and a leveling agent were added so that they accounted for 78.5 mass %, 19 mass %, 0.9 mass %, 1.5 mass %, and 0.1 mass % in terms of solid content, respectively, and the solvent (D) was added so that the total solid content was 40 mass %, followed by stirring at room temperature for 30 minutes to provide a siloxane resin composition S25. The viscosity of this siloxane resin composition was measured by the aforementioned method and found to be 10 mPa·s. Except for using the siloxane resin composition S25 instead of S1, the same procedure as in Example 1 was carried out to prepare a film P25 having an adhesive pattern and a film P25 having an adhesive layer. Results of evaluation performed by the aforementioned method are given in Table 4.

Example 26

In a vial bottle, the siloxane resin A24 prepared in Synthesize example 24, the compound (B) having an unsaturated double bond, the photo-initiator (C), the photoacid generator (E), and a leveling agent were added so that they accounted for 79.7 mass %, 19 mass %, 0.9 mass %, 0.3 mass %, and 0.1 mass % in terms of solid content, respectively, and the solvent (D) was added so that the total solid content was 40 mass %, followed by stirring at room temperature for 30 minutes to provide a siloxane resin composition S26. The viscosity of this siloxane resin composition was measured by the aforementioned method and found to be 10 mPa·s. Except for using the siloxane resin composition S26 instead of S1, the same procedure as in Example 1 was carried out to prepare a film P26 having an adhesive pattern and a film P26 having an adhesive layer. Results of evaluation performed by the aforementioned method are given in Tables 3 and 4.

Example 27

In a vial bottle, the siloxane resin A24 prepared in Synthesize example 24, the compound (B) having an unsaturated double bond, the photo-initiator (C), the photoacid generator (E), and a leveling agent were added so that they accounted for 77.5 mass %, 19 mass %, 0.9 mass %, 2.5 mass %, and 0.1 mass % in terms of solid content, respectively, and the solvent (D) was added so that the total solid content was 40 mass %, followed by stirring at room temperature for 30 minutes to provide a siloxane resin composition S27. The viscosity of this siloxane resin composition was measured by the aforementioned method and found to be 10 mPa·s. Except for using the siloxane resin composition S27 instead of S1, the same procedure as in Example 1 was carried out to prepare a film P27 having an adhesive pattern and a film P27 having an adhesive layer. Results of evaluation performed by the aforementioned method are given in Tables 3 and 4.

TABLE 3

| | | Example 1 | Example 2 | Example 3 | Example 4 | Example 5 | Example 6 |
|---|---|---|---|---|---|---|---|
| Siloxane resin (A) | | A1 | A2 | A3 | A4 | A5 | A6 |
| Siloxane resin composition | | S1 | S2 | S3 | S4 | S5 | S6 |
| Photoacid generator (E) | | 0 | 0 | 0 | 0 | 0 | 0 |
| Viscosity (mPa · s) | | 10 | 10 | 10 | 5,000 | 10 | 10 |
| Coatability | | A | A | A | B | A | A |
| Fine pattern processability | L/S = 100 µm/100 µm | A | A | A | A | A | A |
| | L/S = 20 µm/20 µm | A | B | B | A | A | A |
| Adhesiveness (N/25 mm) | | 2 | 45 | 45 | 20 | 20 | 20 |
| Flexibility of cured film | folding test: 100 times | A | A | A | A | A | A |
| | folding test: 500 times | B | B | B | B | B | A |
| | folding test: 1000 times | B | B | B | B | B | B |
| | folding test: 5000 times | B | B | B | B | B | B |
| Crack resistance | 10 µm | A | B | A | A | A | A |
| | 30 µm | B | B | B | B | B | A |
| Film loss (%) | | 7 | 7 | 7 | 7 | 7 | 7 |

| | | Example 7 | Example 8 | Example 9 | Example 10 | Example 11 | Example 12 |
|---|---|---|---|---|---|---|---|
| Siloxane resin (A) | | A7 | A8 | A9 | A10 | A11 | A12 |
| Siloxane resin composition | | S7 | S8 | S9 | S10 | S11 | S12 |
| Photoacid generator (E) | | 0 | 0 | 0 | 0 | 0 | 0 |
| Viscosity (mPa · s) | | 10 | 10 | 10 | 10 | 10 | 10 |
| Coatability | | A | A | A | A | A | A |
| Fine pattern processability | L/S = 100 µm/100 µm | A | A | A | A | A | A |
| | L/S = 20 µm/20 µm | A | A | A | A | A | A |
| Adhesiveness (N/25 mm) | | 20 | 20 | 20 | 15 | 20 | 20 |
| Flexibility of cured film | folding test: 100 times | A | A | A | A | A | A |
| | folding test: 500 times | A | B | A | B | B | B |
| | folding test: 1000 times | B | B | B | B | B | B |
| | folding test: 5000 times | B | B | B | B | B | B |
| Crack resistance | 10 µm | A | A | A | A | A | A |
| | 30 µm | A | B | A | B | B | B |
| Film loss (%) | | 7 | 7 | 7 | 7 | 7 | 7 |

TABLE 4

|  |  | Example 13 | Example 14 | Example 15 | Example 16 | Example 17 | Example 18 | Example 19 | Example 20 | Example 21 | Example 22 |
|---|---|---|---|---|---|---|---|---|---|---|---|
| Siloxane resin (A) | | A13 | A14 | A15 | A16 | A17 | A18 | A19 | A20 | A21 | A22 |
| Siloxane resin composition | | S13 | S14 | S15 | S16 | S17 | S18 | S19 | S20 | S21 | S22 |
| Photoacid generator (E) | | 0 | 0 | 0 | 0 | 0 | 0 | 0 | 0 | 0 | 0 |
| Viscosity (mPa·s) | | 10 | 10 | 10 | 10 | 10 | 10 | 10 | 10 | 10 | 10 |
| Coatability | | A | A | A | A | A | A | A | A | A | A |
| Fine pattern processability | L/S = 100 μm/100 μm | A | A | A | A | A | A | A | A | A | A |
| | L/S = 20 μm/20 μm | A | A | A | A | A | A | A | A | A | A |
| Adhesiveness (N/25 mm) | | 5 | 30 | 15 | 16 | 17 | 15 | 15 | 20 | 20 | 20 |
| Flexibility of cured film | folding test: 100 times | A | A | A | A | A | A | A | A | A | A |
| | folding test: 500 times | B | B | A | A | A | A | A | A | A | A |
| | folding test: 1000 times | B | B | A | A | A | A | A | A | A | A |
| | folding test: 5000 times | B | B | B | B | A | A | A | A | A | A |
| Crack resistance | 10 μm | A | A | A | A | A | A | A | A | A | A |
| | 30 μm | B | B | B | B | A | A | A | A | A | A |
| Film loss during development (%) | | 7 | 7 | 7 | 7 | 7 | 7 | 7 | 7 | 7 | 7 |

|  |  | Example 23 | Example 24 | Example 25 | Example 26 | Example 27 | Comparative Example 1 | Comparative Example 2 | Comparative Example 3 |
|---|---|---|---|---|---|---|---|---|---|
| Siloxane resin (A) | | A23 | A24 | A24 | A24 | A24 | A'25 | A'26 | A'27 |
| Siloxane resin composition | | S23 | S24 | S25 | S26 | S27 | S28 | S29 | S30 |
| Photoacid generator (E) | | 0 | 0 | 1.5 | 0.3 | 2.5 | 0 | 0 | 0 |
| Viscosity (mPa·s) | | 10 | 10 | 10 | 10 | 10 | 10 | 10 | 10 |
| Coatability | | A | A | A | A | A | A | A | A |
| Fine pattern processability | L/S = 100 μm/100 μm | A | A | A | A | A | B | A | B |
| | L/S = 20 μm/20 μm | B | A | A | A | B | B | A | B |
| Adhesiveness (N/25 mm) | | 15 | 20 | 20 | 20 | 20 | 0.5 | 0 | 20 |
| Flexibility of cured film | folding test: 100 times | A | A | A | A | A | A | A | A |
| | folding test: 500 times | A | A | A | A | A | A | B | A |
| | folding test: 1000 times | A | A | A | A | A | A | B | B |
| | folding test: 5000 times | A | A | A | A | A | B | B | B |
| Crack resistance | 10 μm | A | A | A | A | A | B | B | B |
| | 30 μm | A | A | A | A | A | B | B | B |
| Film loss during development (%) | | 7 | 7 | 2 | 5 | 2 | 7 | 7 | 3 |

Example 28 Preparation of Display Panel Type Display Device

The siloxane resin composition S18 was spread over a silicone-treated PET film (Lumirror (registered trademark) S-10, manufactured by Toray Industries, Inc.) by the slit coating technique so that the film thickness after drying would be 10 μm, to provide a film having a coating film. The resulting film having a coating film was dried on a hot plate at 100° C. for 3 minutes to provide a film having a dried film. The film having a dried film was exposed to light with a dose of 300 mJ/cm² (assumed wavelength 365 nm) from an ultrahigh pressure mercury lamp with an output of 21 mW/cm² through an exposure mask in which a plurality of patterns each having an opening of 136 mm×72 mm were aligned at intervals of 100 μm, to provide a film exposed to patterned light. Subsequently, using a 0.045 mass % aqueous potassium hydroxide solution as developer, shower development was performed until the unexposed portions of the film exposed to patterned light were entirely dissolved to provide a film having an adhesive pattern. The resulting film having an adhesive pattern was diced by a slitter to provide dice of film having an adhesive pattern. The dice of film having an adhesive pattern were transferred onto a polarizing plate (SEG, manufactured by Nitto Denko Corporation) and a phase difference film (SN2, manufactured by Nitto Denko Corporation), which were then attached to either side of a liquid crystal cell (Model 6.1, manufactured by AU Optronics Corp.) using a vacuum laminator under the conditions of 80° C. and 0.2 MPa to provide a display panel type display device. This display panel type display device was subjected to constant-temperature, high-humidity treatment under the conditions of 85° C. and 85% RH for 500 hours using an environment testing machine (PR-1J, manufactured by Espec Corp.) and then observed visually to check for adhesion defects or appearance defects such as foaming, lifting, and peeling of adhesion patterns, and no such defects were found.

INDUSTRIAL APPLICABILITY

The siloxane resin composition and adhesive according to the present invention can be used suitably as an adhesive for use in assembling steps of various electronic instruments such as display devices, semiconductor devices, and lighting devices.

The invention claimed is:

1. A siloxane resin composition comprising a siloxane resin (A) containing a structure as represented by the undermentioned general formula (1), a structure as represented by the undermentioned general formula (2), and a structure as represented by the undermentioned general formula (3), a compound (B) containing an unsaturated double bond, a photo-initiator (C), solvent (D), and a photoacid generator (E):

[Chemical formula 1]

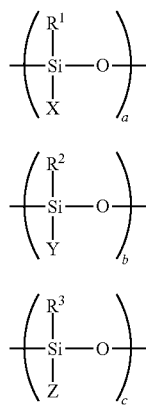

(1)

(2)

(3)

wherein in general formulae (1) to (3), $R^1$, $R^2$, and $R^3$ are each independently a hydrogen atom, a hydroxy group, a group having a siloxane bond, or a monovalent organic group having 1 to 30 carbon atoms; X is an alkenyl group, an alkynyl group, a monovalent organic group having a nitrogen atom and a carbon-oxygen unsaturated bond, or a monovalent organic group having a cyclic ether bond; Y is a monovalent organic group having a photoradical polymerizable group (other than alkenyl groups and alkynyl groups); Z is a monovalent organic group having an alkali soluble group; a, b, and c are each independently an integer of 1 or more; and if a to c are 2 or more, the plurality of $R^1$'s, $R^2$'s, $R^3$'s, X's, and Y's may be identical to or different from each other.

2. A siloxane resin composition as set forth in claim 1, wherein hydrocarbon groups having 1 to 30 carbon atoms account for 10 to 80 mol % relative to the total number of moles of $R^1$, $R^2$, and $R^3$.

3. A siloxane resin composition as set forth in claim 1, wherein a, b, and c account for 10% to 60%, 20% to 60%, and 5% to 35%, respectively, relative to the total molar number of a, b, and c.

4. A siloxane resin composition as set forth in claim 1, wherein in the aforementioned general formulae (1) to (3), X is a vinyl group and/or a monovalent organic group having a cyclic ether bond; Y is a monovalent organic group having a (meth)acryloyl group; and Z is a monovalent organic group having a carboxyl group.

5. A siloxane resin composition as set forth in claim 4, wherein in the aforementioned general formula (1), X contains 8 or more carbon atoms.

6. An adhesive produced from a siloxane resin composition as set forth in claim 1.

7. A cured product with a film thickness of 10 to 200 μm produced by curing a siloxane resin composition as set forth in claim 1.

8. A display device comprising a cured product as set forth in claim 7, a substrate, and at least one selected from the group consisting of liquid crystal cell, organic EL cell, mini-LED cell, and micro-LED cell.

9. A semiconductor device comprising a cured product as set forth in claim 7.

10. A lighting device comprising a cured product as set forth in claim 7.

* * * * *